US005325313A

United States Patent [19]

Herbert et al.

[11] Patent Number: 5,325,313

[45] Date of Patent: Jun. 28, 1994

[54] SYSTEM FOR MEASURING TIMEPIECE BEAT INTERVAL ACCURACY

[75] Inventors: Evelyn J. Herbert, Asheville, N.C.; Melora A. Shultz, Evansville, Ind.; Lionel A. Herbert, Richmond, Vt.

[73] Assignee: H & S Technical Systems, Inc., Evansville, Ind.

[21] Appl. No.: 966,543

[22] Filed: Oct. 26, 1992

Related U.S. Application Data

[63] Continuation-in-part of Ser. No. 555,833, Jul. 20, 1990, abandoned.

[51] Int. Cl.[5] .................... G04F 10/00; G01R 23/02

[52] U.S. Cl. .................................... 364/569; 73/6

[58] Field of Search .................. 364/569, 550, 551.01; 73/6; 368/89, 120, 2, 10

[56] References Cited

U.S. PATENT DOCUMENTS

| | | | |
|---|---|---|---|
| 4,014,205 | 3/1977 | Wells et al. | 73/6 |
| 4,028,927 | 6/1977 | Kikuyama et al. | 73/6 |
| 4,142,238 | 2/1979 | Brandt et al. | 364/569 X |
| 4,168,525 | 9/1979 | Russell | 364/569 |
| 4,367,051 | 1/1983 | Inoue | 364/569 X |
| 4,397,031 | 8/1983 | Weber | 364/569 X |
| 4,456,959 | 6/1984 | Hirano et al. | 364/569 X |
| 4,523,289 | 6/1985 | Soma et al. | 364/569 |
| 4,613,950 | 9/1986 | Knierim et al. | 364/569 |
| 4,613,951 | 9/1986 | Chu | 364/569 |
| 4,637,733 | 1/1987 | Charles et al. | 364/569 X |
| 4,982,350 | 1/1991 | Perna et al. | 364/569 |
| 5,081,297 | 1/1992 | Lebel et al. | 364/569 X |

OTHER PUBLICATIONS

"Koda Tia 2001 Time Internal Analyzer:Operating & Service Manual".

*Primary Examiner*—Kevin J. Teska
*Attorney, Agent, or Firm*—Thomas N. Neiman

[57] ABSTRACT

The invention is of a method of measuring timepiece beat interval accuracy comprising, according to the embodiment shown, a microphone and amplifier to transform the mechanical beat of a timepiece to an electrical signal and amplify that signal. The signal is then sent through a conditioning circuit that makes the signal into a uniform output that represents the beat of the timepiece. The uniform output is then submitted into an input/output port of a computer. This input is then interpreted by the associated software and the resultant data are displayed on a printer or monitor. The displayed material will consist of representations of the relative timing of the mechanical beats of the timepiece or the mechanical malfunction of that timepiece. The method of measuring the timepiece beat interval accuracy comprises the associated software that has been prepared to interpret the data submitted to the computer and to display that data in a predetermined format.

4 Claims, 7 Drawing Sheets

SERIAL PORT INTERRUPT SERVICE ROUTINTE

SYSTEM FOR MEASURING TIMEPIECE BEAT INTERVAL ACCURACY

This is a continuation in part application of our application, Ser. No. 555,833 originally filed on Jul. 20, 1990 and abandoned on Dec. 2, 1992.

BACKGROUND OF THE INVENTION

Field of the Invention

This invention pertains to electronic watch and clock timing analyzer equipment.

There are two methods generally used in the prior art for regulating clocks and watches with electronic timing analyzers. The first such method involves comparison of the frequency of beats (ticks) from a watch or clock to a fixed frequency. The second such method involves measurement of the time interval between beats (hereinafter referred to as "beat interval"), generally using a timer running at a much higher frequency than the timepiece's beat frequency.

Prior art commercial timing analyzers have used fixed frequency generators, which produce frequencies corresponding to common beat frequencies of clocks and watches. Some of the commonest values are 3,600; 18,000; 19,200; 19,800; 21,600; and 28,800 beats per hour. These timing analyzers allow the repair person to select one of the available frequencies, and then compare the beat frequency of the timepiece to it. A simple example is the drum used in the WatchMaster Watch-Rate Recorder; this drum spins at a strictly regulated rate of 5 revolutions per second, and every time a beat occurs a mark is recorded on the paper wrapped around the drum, (and the pen which marks the paper is moved slightly, in a direction parallel to the axis of the drum). If the watch is beating at exactly 5 beats per second, then a straight line will be marked across the paper. Any variations in rate will show up in deviations from that line. This approach has a distinct advantage in that beat frequency errors are very easily read and interpreted by the repair person.

The second technique used, that of measuring the time interval between beats (the reciprocal of the beat frequency), has the significant advantage of allowing much wider variation in the beat frequencies that can be measured easily. Currently available prior art devices which use this approach generally are of two kinds. The first kind displays on a digital display a numerical average of beat interval measurements (the user controls how many interval measurements are averaged together). This sort has the advantage of being simple to operate, but has the drawback of being difficult to read and interpret, especially if the beat rate is high. The second kind of prior art device displays, on a digital display, graphs of each beat interval, presented so as to resemble the results of the "drum method" mentioned above. This has the advantage of being easy to read and interpret, but has the drawback that it does not display the numerical average of a number of beat interval measurements; consequently, if presented with an antique watch or clock which does not run at one of the common beat frequencies, the user cannot determine what average frequency it is running at in order to get an idea of the ideal beat frequency for the timepiece.

SUMMARY OF THE INVENTION

Thus there is a need for a timing analyzer which is capable of measuring the beat interval for a timepiece, and 1. allowing the ideal beat frequency (and hence the ideal beat interval) to be continuously varied over a wide range of beat frequencies (and hence ideal beat intervals) by measuring the beat interval using a high-frequency timer;
2. displaying the average beat interval;
3. displaying the average beat frequency;
4. displaying the error (deviations) from the ideal beat interval in an easily-read graph; and
5. displaying the error (deviations) from the ideal beat frequency in an easily-read graph.

This invention provides all of these capabilities and in addition avoids (since it uses electronics) the problems associated with electromechanical timing analyzers of the prior art.

This invention permits the clock or watch repair person to set a timepiece's rate, detect out-of-round wheels, detect and correct for out-of-beat conditions (the situation where the time between tick and tock differs from the time between tock and tick), detect binding wheels, and detect variations in rate due to mainsprings which do not unwind smoothly. Above all, it combines all of these functions in one invention, rather than requiring the repair person to work with a variety of different timing equipment, as in the prior art.

This invention is used, after starting the software (by attaching the hardware unit and typing the program name), by setting the ideal beat frequency (the program initially sets this to 18,000 beats per hour), or by setting the ideal beat interval (the program initially sets this to 0.200000 seconds per beat). Setting either value causes the other to be set as well. The ideal beat frequency may be set to any value from 1.3 beats per hour to 80,000 beats per hour, in steps of 0.0001 beats per hour. The program presents one of two displays at any given time:

1. a display showing a graphical representation of measured beat intervals compared with the ideal beat interval, in such a way that the timepiece error can be read in seconds per day and such that timepiece beat irregularities can be diagnosed; and
2. a display showing a graphical representation of measured beat frequency compared with the ideal beat frequency; the average beat interval; and the average beat frequency. This software initially averages over every two (2) beats but the user can set it to average over anywhere from every beat to every 64,000 beats. The hardware unit is coupled both to the computer, via an I/O port, and to the timepiece, via a contact microphone pickup device. The beat signal entering the computer is timed using one of the hardware timers in the computer, and the duration between beats is recorded (and the timer is controlled) by interrupt handling software. When and how the timing measurements are displayed is under the control of the user, via the "mainline" (non-interrupt) software. This mainline software enables the user to start and stop the graphical display of beat interval or beat frequency measurements, and to set the number of beat intervals to be encompassed in the display of average beat interval and average beat frequency. The skilled technician can use the indications of timepiece beat irregularity to diagnose faults in both clocks and watches, and can use the indications of beat frequency error on either screen to regulate a clock or watch (that is, to set it to the correct beat rate). Use of the screen showing the beat intervals in graphical form is recommended for correcting "out of beat" errors.

DESCRIPTION OF THE PREFERRED EMBODIMENTS

Basically, the present invention operates to measure the time interval between timepiece beats (the so-called "beat interval" of the timepiece) and then presents that measurement to the user, along with other calculated values, to enable the user to diagnose faults in the operation of the timepiece.

Figure 1:
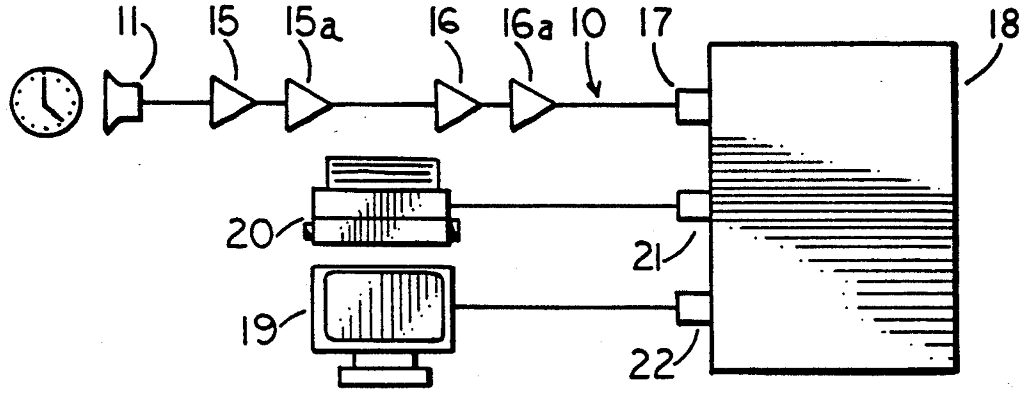
FIG. 1 is a schematic system drawing showing the hardware unit and the display and data entry means, in relation to the preferred embodiment of this invention.
Figure 2:
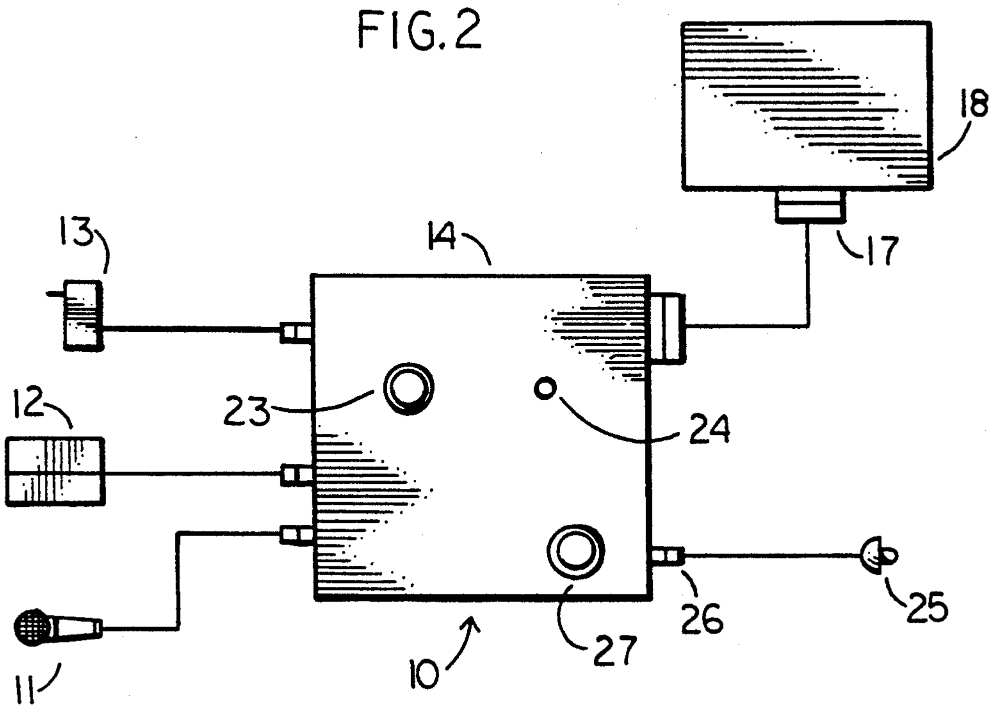
FIG. 2 is a perspective view of the novel means.
Figure 3:
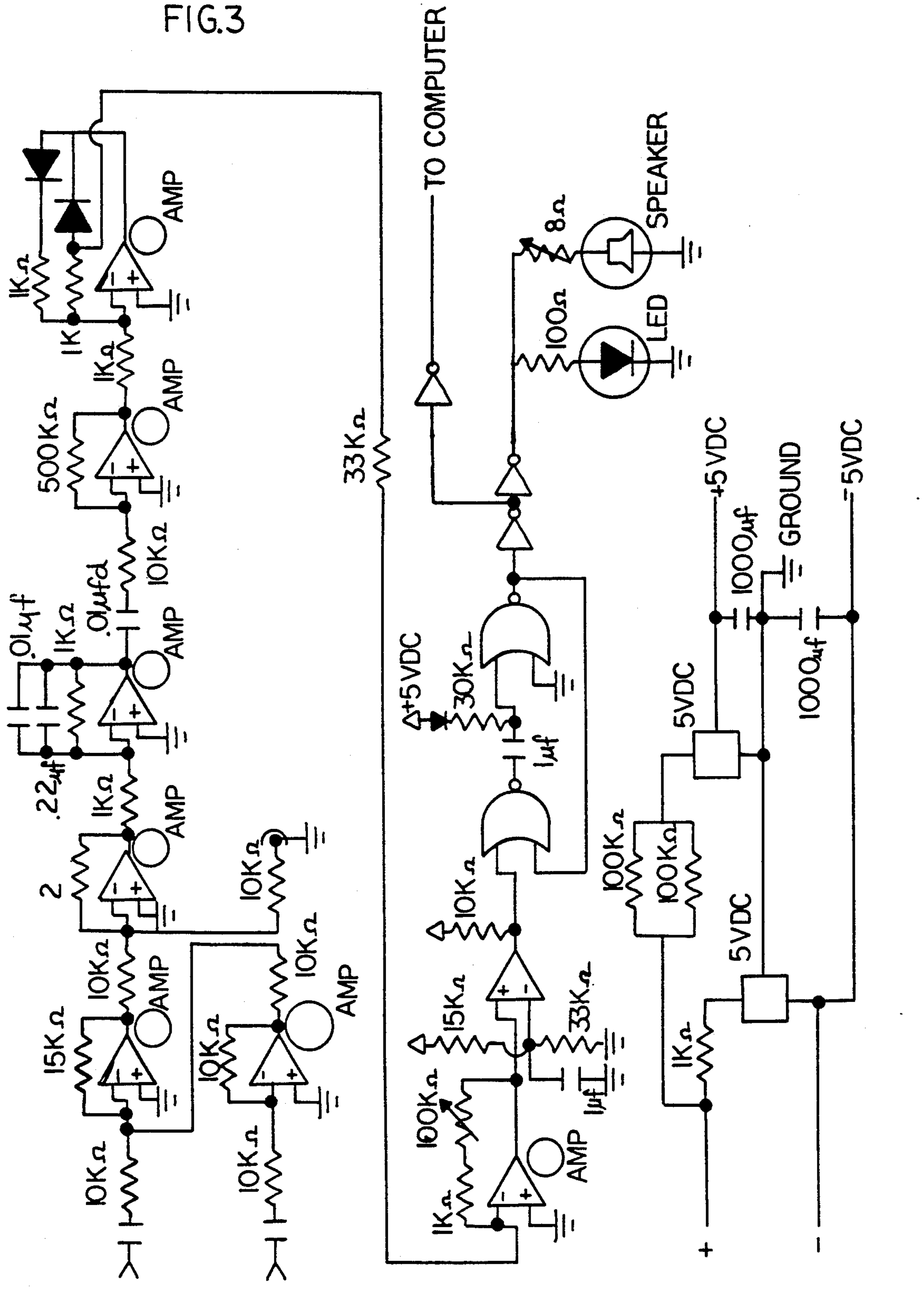
FIG. 3 is a schematic view of the circuitry of the novel means.

As shown in FIG. 1, the preferred embodiment of the present invention has a contact microphone pickup device 11, which converts the beating of the timepiece into an electrical signal. Said electrical signal is then amplified and filtered and converted into a digital signal by the hardware unit 15. Said digital signal is a pulse, generated by said hardware unit 15 as a result of said electrical signal from the pickup device 11.

Figure 6:
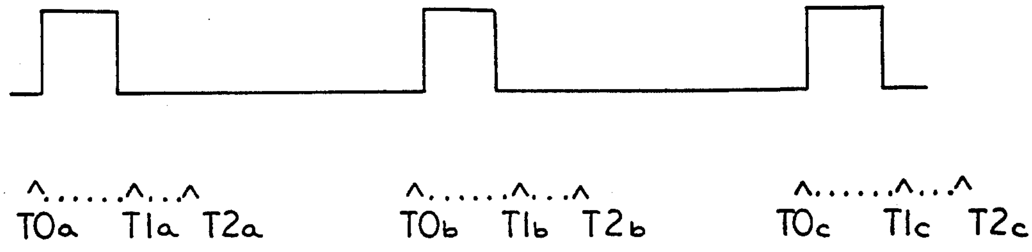
FIG. 6 is a diagram showing the timing relationship between the pulses from the hardware unit and the operations of the novel method embodied in software.

Said digital signal is presented to the serial input port 17 of the computer 18. During normal operation of this invention, said digital signal at serial input port 17 results in a hardware interrupt (see FIG. 6, time t0x). This causes the serial port interrupt handler software to execute. Said serial port interrupt handler software (see FIGS. 4*e* and 4*f*) a.) preserves the current state of the processor registers; b.) detects the cause of the interrupt, and, if it is due to a beat, reads the hardware timer value (see FIG. 6, time t1x), restarts the hardware timer (see FIG. 6, time t2x), adds said timer value to the "running average" variable, and stores said timer value in a buffer (if the main program has set the "store data" variable to a non-zero value); c.) writes an "end of interrupt" command to the interrupt controller hardware; d.) restores the state of the processor registers; and e.) executes an instruction to return from the interrupt handler software. Thus said interrupt handler software, in conjunction with the I/O port hardware, provides a basic mechanism for storing timer counts of beat intervals. However, as shown in FIG. 6, these timer counts are not accurate; they are incorrect by an amount dependent upon the speed of the processor and I/O bus, since the hardware timer must be restarted, which takes a finite amount of time. The amount of this correction is determined by the "calibrate" routine.

Figure 4:
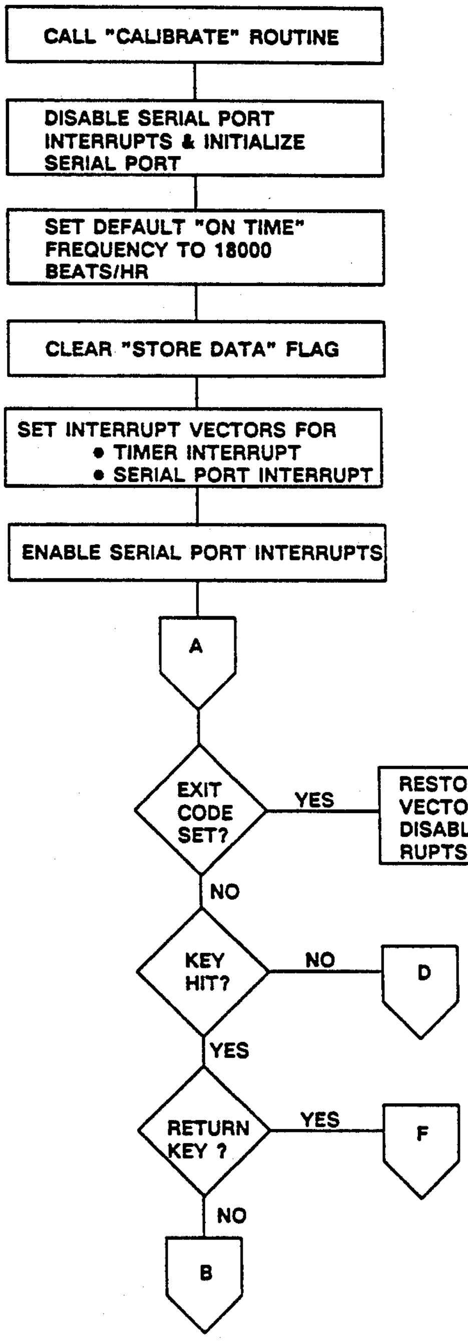
FIGS. 4 through 4G are a flow diagram for the novel method of measuring timepiece beat interval and providing the capabilities of the present invention.
Figure 4:
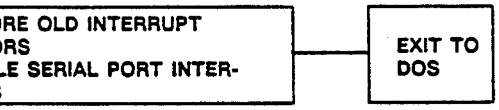
Figure 4A:
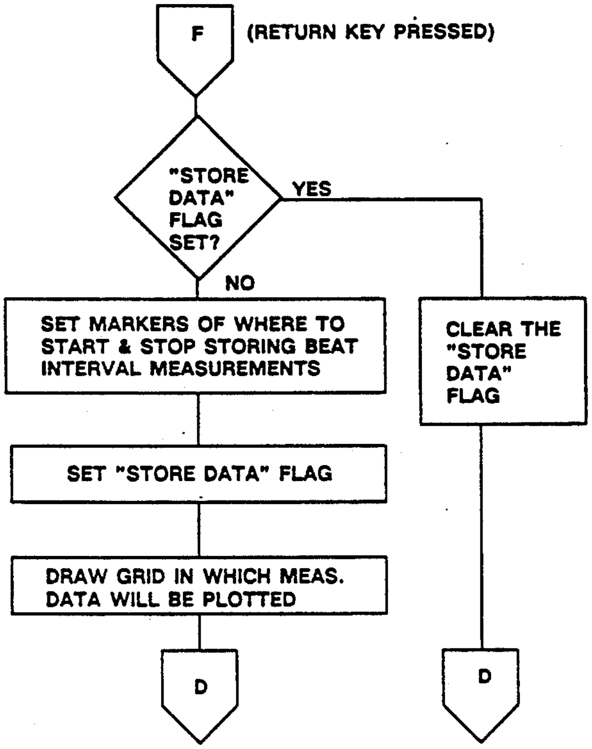
Figure 4B:
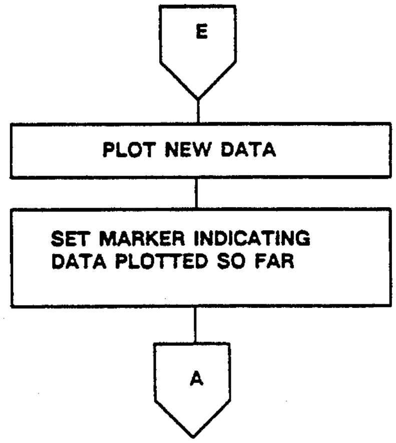
Figure 4C:
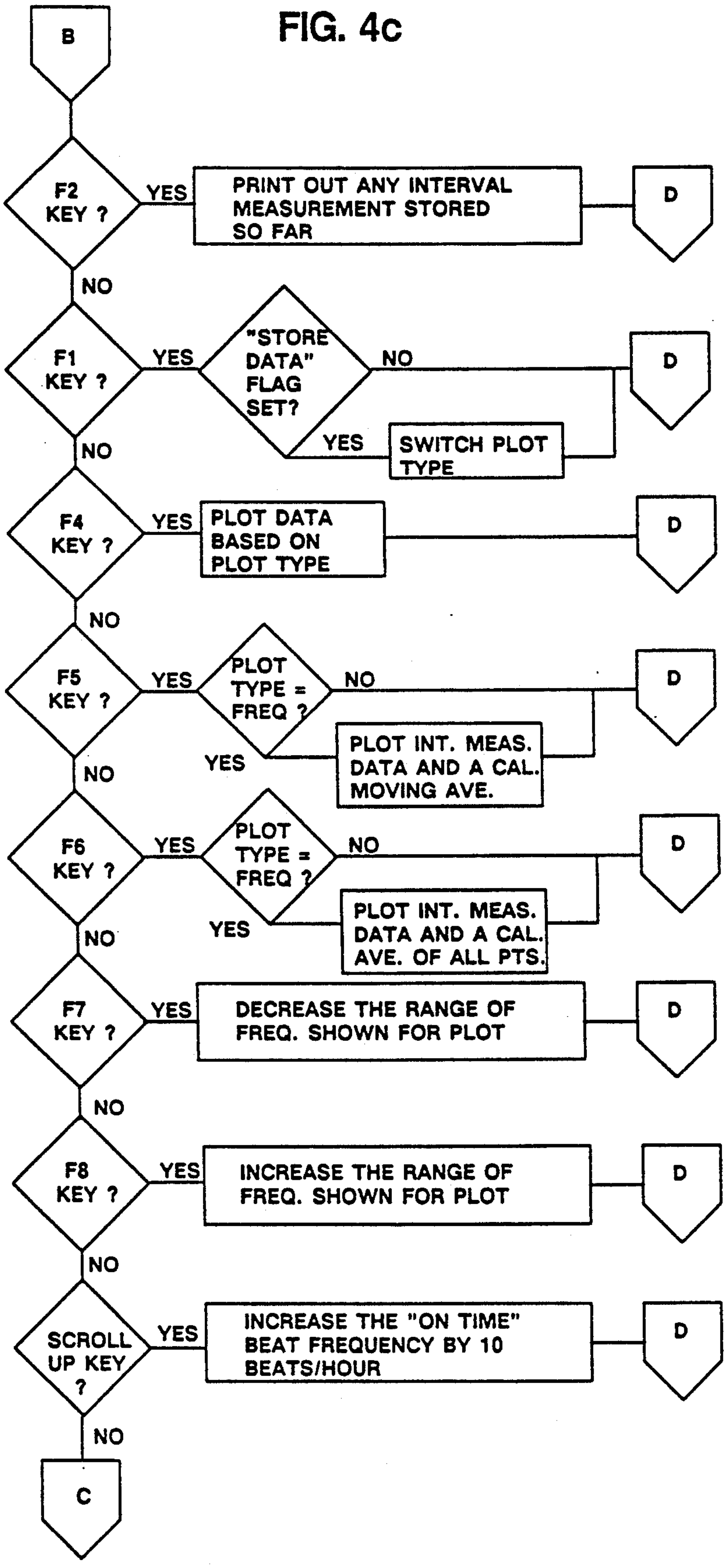
Figure 4D:
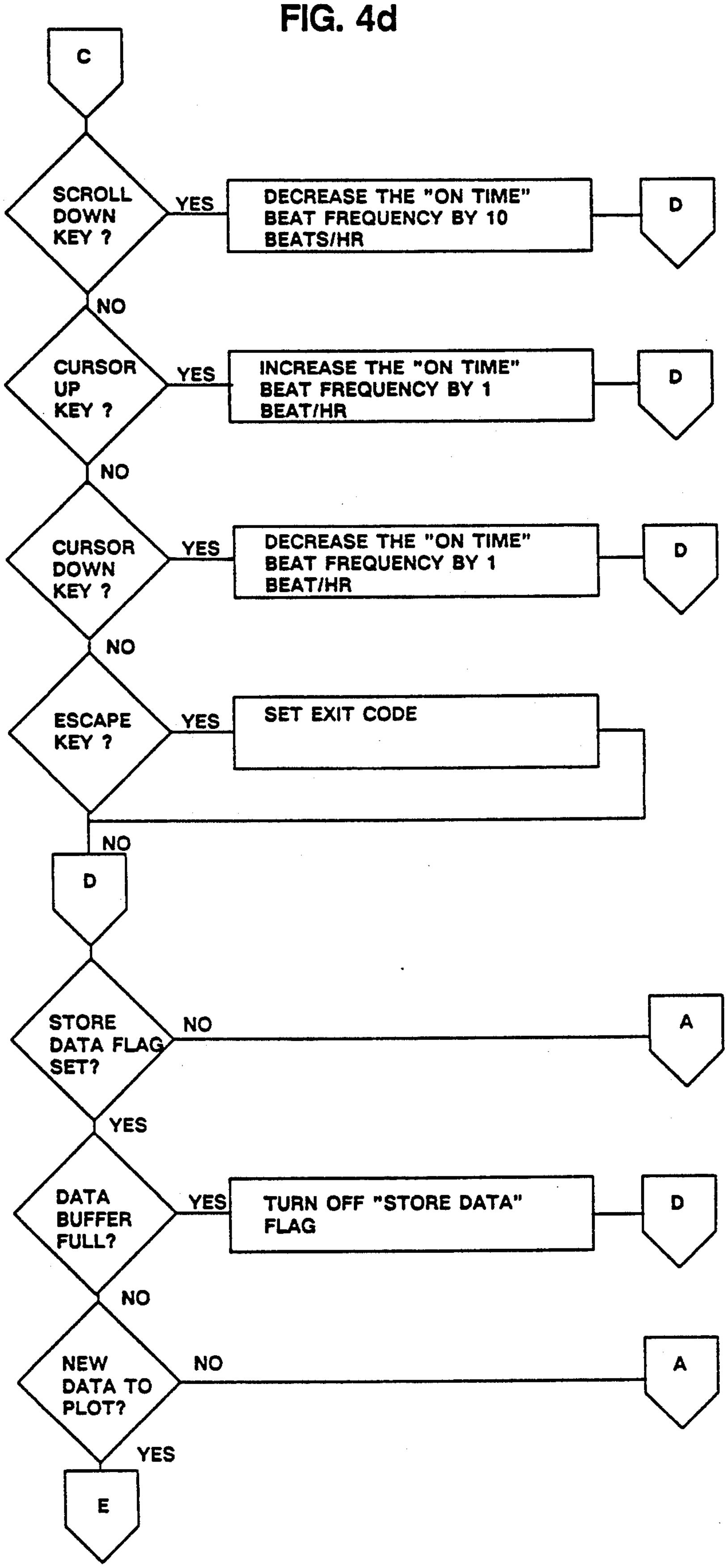
Figure 4E:
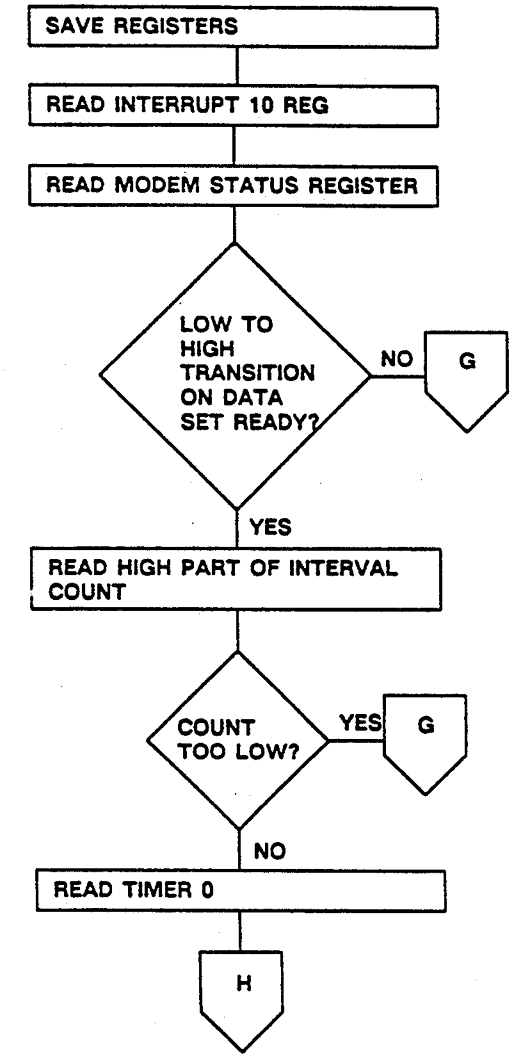
Figure 4F:
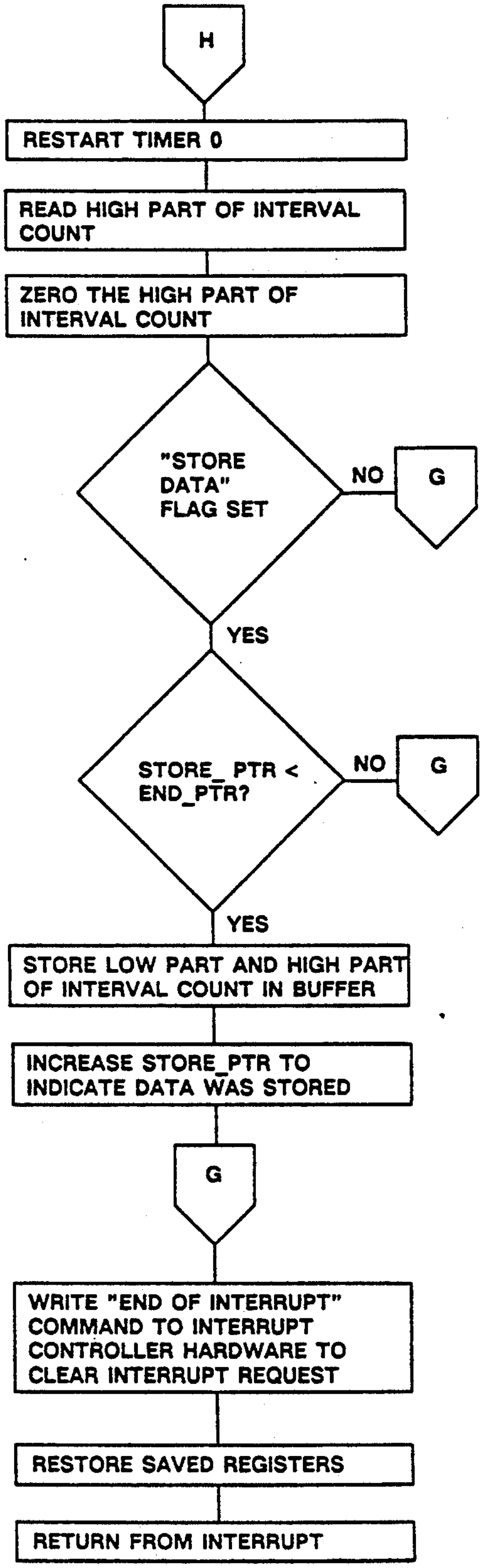
Figure 4G:
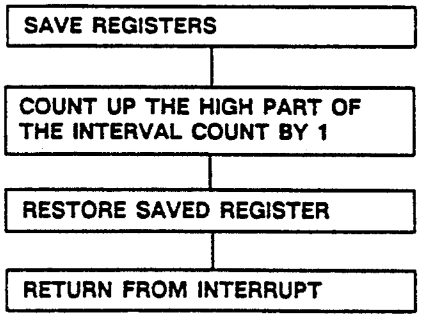
Figure 5:
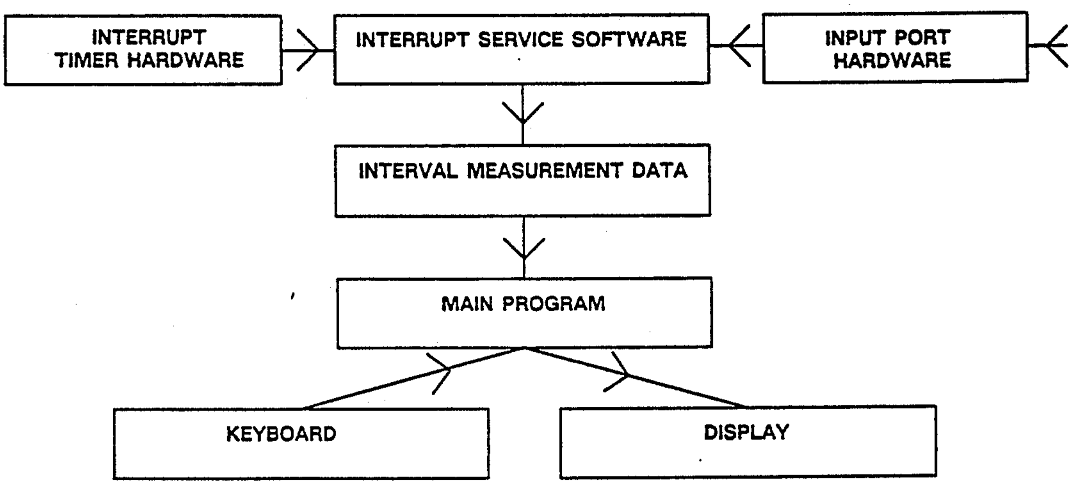
FIG. 5 is a diagram showing the overall flow of data in the present invention.

Referring to FIG. 4:

The first routine which is called by the main program is the "calibrate" routine.

Referring to FIG. 6:

The beat interval that is to be measured is the time from T0a to T0b. That is, the time from the leading edge of one beat to the leading edge of the next beat. The time between T1a and T1b should be equal to the time from T0a to T0b, since the same amount of time is always required for entering the interrupt handling software and reading the hardware timer contents. The time that is measured is T2a to T1b, since the hardware timer must be reloaded and restarted. The time between T1a and T2a will be constant every time the interrupt handling software runs. This is the time which is measured by the "calibrate" routine.

How the "calibrate" routine works:

The "calibrate" routine works by a.) storing the current contents of the processor registers; b.) initializing the timer for the counting mode in which it will be used; c.) reading the contents of the hardware timer (this moment is represented by the time t1x in FIG. 6); d.) delaying for the number of cycles that the processor will expend in restarting the hardware timer; e.) reading the contents of the hardware timer (this moment is represented by the time t2x in FIG. 6); storing the count values read in steps c and e above; f.) restoring the contents of the processor registers; and g.) returning the calling routine. The difference between the two said count values is the time between T1x and T2x in FIG. 6.

After the calibrate routine has been run, and this time (T1a to T2a) has been measured, every interval measurement which is made is adjusted by that amount. This is necessary because the hardware timer is reloaded and restarted by the interrupt handling software; the (T1a to T2a) "overhead" time will vary based on the speed of the computer and must be measured so that the beat interval measurements can be corrected.

The above novel method provides a technique for measuring the beat interval to within the precision of the hardware timer (in the preferred embodiment this is approximately +/−838 nanoseconds) independent of the speed of the processor.

Referring again to FIG. 4:

After calling the "calibrate" routine, the main program initializes the I/O (serial) port; initializes the variable representing the ideal frequency at 18000 beats per hour; initializes the "store data" variable to zero, indicating that no measurements should be stored by the interrupt handler software; initializes the variable representing the number of beat intervals to be included in the "running average" at a value of 2; sets the interrupt vectors for the interrupt handler software, saving the previous values of these vectors; and enables interrupts from the I/O (serial) port. Said interrupt handler software will be executed as explained in the above paragraphs.

Then said main program enters a loop, in which it continually checks for a key input from the user.

If the user presses the Escape key, said main program restores the previous values of the interrupt vectors, disables the I/O (serial) port interrupts, and exits to the operating system.

If the user presses the Enter (Return) key, said main program tests to see whether the "store data" variable contains a value of zero.

IF SO, said main program sets variables indicating to said interrupt handler software where (what memory addresses) the count values should be stored; sets the "store data" variable to a non-zero value, indicating to the interrupt handler software that count values should be stored (see above description of said interrupt handler software); and draws a grid pattern on the display, in which the measurement data will be plotted. This effectively begins the collection of beat interval timing data.

IF NOT, said main program sets the "store data" variable to a value of zero, to indicate to said interrupt handler software that the count values should not be stored. This effectively halts the collection of beat interval timing data. If the user presses the F1 key, said main program tests to see whether the "store data" variable contains a value of zero.

IF SO (beat interval timing data are not being collected), said main program tests the variable indicating the type of grid to be displayed. If said variable contains a value of 0 (to display beat intervals on the grid), said main program sets the variable to a value of 1 (to display beat frequencies); however, if said variable contains a value of 1, said main program sets the variable to a value of 0. This effectively "toggles" the method of presentation of the timing data.

IF NOT (beat interval timing data are being collected), said main program takes no action other than to remain in the main loop, awaiting another keystroke input from the user.

If the user presses the F5 key, said main program tests to see whether the "store data" variable contains a value of zero.

IF SO (beat interval timing data are not being collected), said main program tests the variable indicating the type of grid to be displayed. If said variable contains a value of 1 (to display beat frequencies on the grid), said main program calculates an average frequency over all stored beat interval measurements, as follows:

a.) Each beat interval timer count stored in said buffer by the interrupt handler software is increased by the "calibration factor" as determined by the "calibrate" routine to produce a "compensated timer count"; the frequency of the hardware timer (in the preferred embodiment this is 1,193,180 cycles per second) is multiplied by 3,600 seconds per hour, and this result is then divided by said "compensated" timer count.

Said calculation produces a measured beat frequency in beats per hour from said compensated timer count. That is, $$\text{meas. beat freq (bph)} = \frac{(1{,}193{,}180 \text{ counts/s}) \times (3600 \text{ s/hr})}{\text{timer counts} + \text{"calibrate" counts}}$$

b.) Said measured beat frequencies are summed and then divided by the number of said measurements, producing a simple average of the beat frequency over the duration of the data collection.

c.) A line representing said calculated average beat frequency is plotted on the display, within the bounds of the grid displayed for this purpose. These method steps, then, provide a graphical display of the average beat frequency of the timepiece.

IF NOT (beat interval timing data are being collected), said main program takes no action other than to remain in the main loop, awaiting another keystroke input from the user.

If the user presses the F7 key, said main program tests the variable indicating the type of grid to be displayed. If said variable contains a value of 1 (to display beat frequencies on the grid), said main program decreases the range of frequencies displayed on the grid by 360 seconds (initially the grid displays values from 60 minutes fast per day to 60 minutes slow) per day as compared with said ideal beat frequency. This produces a "zoom in" effect, allowing the user to increase the resolution of the grid displayed, a novel capability in timing analyzers for timepieces. Said novel method allows the user to directly measure and read timing errors as small as 1 second/day to more than 60 minutes per day on the same instrument, for any beat frequency from 1.3 to 80,000 beats per hour.

If the user presses the F8 key, said main program tests the variable indicating the type of grid to be displayed. If said variable contains a value of 1 (to display beat frequencies on the grid), said main program increases the range of frequencies displayed on the grid by 360 seconds (initially the grid displays values from 60 minutes fast per day to 60 minutes slow per day). This produces a "zoom out" effect, allowing the user to decrease the resolution of the grid displayed, a novel capability in timing analyzers for timepieces. Thus the user can directly measure and read timing errors of more than 60 minutes per day at any beat frequency from 1.3 to 80,000 beats per hour.

If the user presses the F9 key, said main program displays a message on the display requesting that the user enter a new value for the ideal beat frequency; accepts the keyed input from the user, and (if the value is between 1.3 and 80,000, inclusive), sets said variable representing said ideal beat frequency to said keyed value. These method steps, as part of the whole invention, allow the user to continually vary the ideal beat frequency between 1.3 and 80,000 beats per hour.

If the user presses the F10 key, said main program displays a message on the display requesting that the user enter a new value for the ideal beat interval; accepts the keyed input from the user, and (if the value is between 0.045 and 2769, inclusive), sets said variable representing said ideal beat frequency to 3600 divided by said keyed value. (Said ideal frequency in beats per hour is equal to 3600 seconds per hour divided by said ideal beat interval in seconds per beat.) These method steps, as part of the whole invention, allow the user to continually vary said ideal beat interval between 0.045 and 2,769 seconds per beat, and hence continually vary said ideal beat frequency between 1.3 and 80,000 beats per hour.

If the user has not pressed a key, said main program a.) tests whether the "store data" variable contains a value of zero.

IF NOT (beat interval timing data are being collected), said main program tests the variable indicating where the collected timer count data are to be stored. If said variable value indicates that said buffer is full, said main program sets the contents of said "store data" variable to a value of zero.

b.) tests the variable indicating where the collected timer count data are to be stored in said buffer by said interrupt handler software.

If said variable indicates that said timer count data is being stored,

1.) Each beat interval timer count stored in said buffer by said interrupt handler software is increased by said "calibration factor" as determined by the "calibrate" routine to produce a "compensated timer count"; the frequency of the hardware timer (in the preferred embodiment this is 1,193,180 cycles per second) is multiplied by 3,600 seconds per hour, and this result is then divided by said "compensated" timer count. Said calculation produces a measured beat frequency in beats per hour from said compensated timer count. That is, $$\underset{\text{(bph)}}{\text{meas. beat freq}} = \frac{(1{,}193{,}180 \text{ counts/s}) \times (3600 \text{ s/hr})}{\text{timer counts/bt} + \text{"calibrate" counts/bt}}$$

2.) Said main program tests the variable indicating the type of grid to be displayed.

If said variable contains a value of 1 (to display beat frequencies on the grid), said main program plots each of the said measured beat frequencies on said grid, as a point, so that a horizontal line represents a constant beat frequency and the displacement of said line from the top of said grid indicates said beat frequency value.

If said variable contains a value of 0 (to display beat intervals on the grid), said main program a. divides 3600 by said measured beat frequency to obtain the measured beat interval in seconds per beat;
b. calculates the ideal beat interval by dividing 3600 by the ideal beat frequency. This gives the ideal beat interval in seconds per beat;
c. divides said measured beat interval by said ideal beat interval to determine the number of intervals (including fractions) to displace the next interval point to be plotted on said grid; and
d. plots said interval as a point on said grid.

3.) Said running average variable which has been added to by the interrupt handler software is divided by said variable representing the number of beat intervals to be averaged, and the result of said division is increased by said "calibration factor". Said result is the average measured beat timer count.

4.) The frequency of the hardware timer (in the preferred embodiment this is 1,193,180 cycles per second) is multiplied by 3,600 seconds per hour, and this result is then divided by said average measured beat timer count. The result of this division is the average measured beat frequency in beats per hour.

5.) Said average measured beat frequency in beats per hour is then written to the display in numeric form.

6.) Said average measured beat timer count is then divided by the frequency of the hardware timer (in the preferred embodiment this is 1,193,180 cycles per second). This result is the average measured interval in seconds per beat.

7.) The average measured interval in seconds per beat is then written to the display in numeric form.

8.) The frequency of the hardware timer (in the preferred embodiment this is 1,193,180 cycles per second) is divided by said average measured beat timer count. The result of this division is the average measured beat frequency in beats per second.

9.) Said average measured beat frequency in beats per second is then written to the display in numeric form.

If the user presses the F2 key, said main program sets said running average of the beat interval (and consequently the running average of the beat frequency) to zero.

If the user presses the F6 key, said main program displays a message on the display requesting that the user enter a new value for the number of measured beat intervals to include in said "running average"; accepts the keyed input from the user, and (if the value is between 1 and 30,000, inclusive), sets the number of measured beat intervals to include in said "running average" to said keyed value.

This novel method displays the timepiece's average beat frequency in beats per second and in beats per hour, as well as its average beat interval in seconds per beat, while allowing the user to vary the number of beats averaged over a range of 1 to 30,000.

This novel method displays the timepiece's beat frequency in a graphical manner so that the skilled user can easily detect faults in a timepiece, not only fast/slow errors, but operational problems such as bent escape wheel teeth.

This novel method displays the timepiece's beat interval in a graphical manner so that the skilled user can easily detect faults in a timepiece, not only fast/slow errors, but operational problems such as out-of-beat conditions.

While we have described our invention in connection with a specific embodiment thereof, it is clearly to be understood that this is done only by way of example and not as a limitation to the scope of our invention as set forth in the objects thereof and in the appended claims.

We claim:

1. A system for measuring timepiece beat interval accuracy, for use by personnel repairing clocks and watches, comprising:

a digital computer means having keyboard means for control and numeric inputs and having display means for graphical and character outputs;

means for receiving a digital input signal, which represents the timepiece's beat by a digital pulse, into said digital computer;

means for generating an interrupt signal within said digital computer, from said digital input pulse;

means for causing execution of an interrupt service program upon generation of said interrupt signal;

means for generating a clock signal having a predetermined frequency and clock period;

a counter providing a digital output and connected to said clock signal and to said digital computer;

means for reading the contents of said counter under control of said digital computer;

means for restarting said counter under control of said digital computer;

means for calibration of said system by measuring the time interval between the reading of said counter and the restarting of said counter, which is the inherent error in each beat interval measurement, thus allowing for compensation for that error;

an interrupt service program;

a displaying program which displays on said display means, beat interval measurement data relative to an ideal beat interval entered using said keyboard means or calculated from an ideal beat frequency entered using said keyboard means, in order to show the measured timing errors for any timepiece beat frequency, to allow detection of rate errors and other faults;

a displaying program which displays on said display means, beat frequency measurement data relative to an ideal beat frequency entered using said keyboard means or calculated from an ideal beat interval entered using said keyboard means in order to show the measured timing errors for any timepiece beat frequency, to allow detection of rate errors and other faults;

a displaying program which displays average beat frequency and average beat interval, said average values being calculated over a number of beats having been entered using said keyboard means; and digital control means for repeating operation of said displaying program based upon input from said keyboard means.

2. A system for measuring timepiece beat interval accuracy, according to claim 1, wherein:

said interrupt service program comprises means for reading the contents of said counter under the control of said digital computer;

said interrupt service program further comprises means for restarting said counter under control of said digital computer;

said interrupt service program further comprises digital storage means for storing a digital value as a running total value within said digital computer;

said interrupt service program further comprises digital arithmetic means for adding said contents read from said counter to said running total valve;

said interrupt service program further comprises digital arithmetic means and storage means for increasing the value of a beat count by one each time a digital value is stored as a running total value within said digital computer;

said interrupt service program further comprises digital control and storage means for storing the number 0 as said beat count, storing said running total value as a final running total value as a final running total, and storing the number 0 as said running total value, when said beat count becomes equal to a maximum beat count;

said interrupt service program further comprises digital storage means for storing a digital value as a timing measurement value within said digital computer;

said interrupt service program further comprises digital control means to avoid storage of said timing measurement value, based upon said storage control value; and said interrupt service program further comprises digital control means to exit said interrupt service program.

3. A system for measuring timepiece beat interval accuracy, according to claim 1, wherein:

said calibration means comprises means for reading the contents of said counter under control of said digital computer;

said calibration means further comprises digital storage means for storing a digital value as a first measurement value within said digital computer, following operation of said reading means;

said calibration means further comprises digital storage means for storing a digital value as a second measurement value within said digital computer, following operation of said reading means;

said calibration means further comprises digital arithmetic means for subtracting said second measurement value from said first measurement value within said digital computer; and said calibration means further comprises digital storage means for storing a digital value as an inherent error value within said digital computer, representing the delay between said reading of said counter and said reading again of said counter; for the purpose of using that value to compensate for said error.

4. A system for measuring timepiece beat interval accuracy according to claim 1, wherein:

said displaying program comprises digital storage means for altering said data storage control value based upon input from said keyboard means;

said displaying program further comprises digital storage means for altering said maximum beat count based upon input from said keyboard means;

said displaying program further comprises digital arithmetic means for adding said inherent error value to said timing measurement value to produce a compensated interval measurement value;

said displaying program further comprises digital arithmetic means for calculating a compensated frequency measurement value from said compensated interval measurement value;

said displaying further comprises digital arithmetic means and storage means for calculating a timepiece's ideal beat interval from said timepiece's ideal beat frequency, storing said timepiece's ideal beat interval, and storing said timepiece's ideal beat frequency, when said timepiece's ideal beat frequency is entered using said keyboard means;

said displaying further comprises digital arithmetic means and storage means for calculating a timepiece's ideal beat frequency from said timepiece's ideal beat interval, storing said timepiece's ideal beat frequency, and storing said timepiece's ideal beat interval, when said timepiece's ideal beat interval is entered using said keyboard means;

said displaying further comprises means for displaying in a graphical manner on said display means, said compensated interval measurement values, relative to said timepiece's ideal beat interval, so that deviations of said compensated interval measurement values form said timepiece's ideal beat interval are apparent;

said displaying program further comprises means for displaying in a graphical manner on said display means, said compensated frequency measurement values, relative to said timepiece's ideal beat frequency, so that deviations of said compensated frequency measurement values from said timepiece's ideal beat frequency are apparent;

said displaying program further comprises digital arithmetic means and display means for calculating an average beat interval from said final running total, said maximum beat count, and said inherent error value and displaying said average beat interval on said display means; and said displaying program further comprises digital arithmetic means and display means for calculating an average beat frequency from said final running total, said maximum beat count, and said inherent error value and displaying said average beat frequency on said display means.

* * * * *